United States Patent
Mishima et al.

(10) Patent No.: US 7,056,585 B2
(45) Date of Patent: Jun. 6, 2006

(54) PREPREG AND LAMINATE

(75) Inventors: Hiroyuki Mishima, Tokyo (JP); Tsuyoshi Isozaki, Tokyo (JP); Hidenori Kimbara, Tokyo (JP); Norio Nagai, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 167 days.

(21) Appl. No.: 10/626,574

(22) Filed: Jul. 25, 2003

(65) Prior Publication Data

US 2004/0166324 A1  Aug. 26, 2004

(30) Foreign Application Priority Data

Jul. 25, 2002 (JP) .............................. 2002-216723

(51) Int. Cl.
*C08K 3/22* (2006.01)
(52) U.S. Cl. .................... 428/413; 428/418; 428/447; 524/437; 523/457
(58) Field of Classification Search ............... 428/413, 428/418, 447, 448, 450, 702; 524/441; 523/457

See application file for complete search history.

(56) References Cited

U.S. PATENT DOCUMENTS

| | | | | |
|---|---|---|---|---|
| 5,264,065 A | * | 11/1993 | Kohm | 156/307.4 |
| 5,368,921 A | * | 11/1994 | Ishii et al. | 442/232 |
| 6,097,089 A | * | 8/2000 | Gaku et al. | 257/712 |
| 6,645,630 B1 | * | 11/2003 | Nakamura et al. | 428/413 |

FOREIGN PATENT DOCUMENTS

| | | | |
|---|---|---|---|
| EP | 118031 | * | 9/1984 |
| EP | WO 98/31538 | * | 7/1998 |
| JP | 63195114 | * | 8/1988 |
| JP | 2001329080 | * | 11/2001 |

* cited by examiner

*Primary Examiner*—David J. Buttner
(74) *Attorney, Agent, or Firm*—Wenderoth, Lind & Ponack, L.L.P.

(57) ABSTRACT

A prepreg comprising a thermosetting resin (D) composition containing, as an essential component, an aluminum hydroxide-boehmite composite (A) obtained by hydrothermal treatment of aluminum hydroxide, and a substrate (I), a laminate using the above prepreg, and a metal-foil-clad laminate using the above laminate.

9 Claims, No Drawings

PREPREG AND LAMINATE

BACKGROUND OF THE INVENTION

1. Field of the Invention

The present invention relates to a prepreg using a thermosetting resin composition having excellent moldability and excellent heat resistance and flame resistance, and a laminate and a metal-foil-clad laminate each of which uses the above prepreg.

2. Description of Prior Art

As a printed wiring board material for electronic equipment, there are widely used a prepreg using an epoxy resin or BT (bismaleimide/triazine) resin composition, a laminate obtained by curing the above prepreg under heat, and a multilayer board using a combination of the above laminate and the above prepreg. As a method for imparting flame retardancy to these printed wiring board materials, there is generally adopted a recipe containing a bromine type compound. In recent years, however, a variety of regulations for bromine type flame retardants are discussed in view of environmental issues and combinations of various flame-retardant compounds are studied for the purpose of producing a halogen-free material.

In addition, a lead-free solder is coming to be used in place of a conventional lead solder at the time of mounting electronic parts. In accordance with the above, it is unavoidable that a temperature at the time of solder reflow increases by 20 to 30° C. Therefore, a printed wiring board material which can endure a high reflow temperature and is excellent in solder heat resistance, becomes indispensable. It is strongly desired to develop a halogen-free material which is excellent in solder heat resistance and is environmentally friendly.

For the above movements, for example, as for an epoxy resin-based printed wiring board material, various halogen-free flame retardants are studied for aiming to delete brominated epoxy resins. The mainstream of currently-proposed examples is a method using a compound containing phosphorus or nitrogen in combination with aluminum hydroxide. However, since aluminum hydroxide starts to undergo a dehydration reaction at approximately 200° C., there is a limitation in regard to solder heat resistance.

As a means to improve the heat resistance of aluminum hydroxide, there is disclosed a method in which aluminum hydroxide is partially dehydrated by heating to decrease the apparent number of moles of a crystallization water to 1.8–2.9 (JP-A-51-27898). When such aluminum hydroxide is added to a thermosetting resin, irregularities occur on a molded appearance due to an influence of pores caused by the thermal dehydration treatment. Therefore, it is difficult to apply the above aluminum hydroxide to a general printed wiring board material.

Currently, concerning a halogen-free flame-retardant printed wiring board material using an epoxy resin of a BT resin as a base material, there is generally adopted a method using aluminum hydroxide as a flame retardant concurrently. However, aluminum hydroxide itself is insufficient in heat resistance, and a laminate obtained by incorporating it in a thermosetting resin has a limitation in solder heat resistance. There is hardly found a halogen-free flame-retardant printed wiring board material having solder heat resistance applicable to a lead-free solder which requires a temperature higher than a conventional temperature.

SUMMARY OF THE INVENTION

It is an object of the present invention to provide a prepreg using a halogen-free flame-retardant thermosetting resin composition excellent in moldability and solder heat resistance, and a laminate and a metal-foil-clad laminate each of which uses the above prepreg.

The present invention provides a prepreg comprising a thermosetting resin (D) composition containing, as an essential component, an aluminum hydroxide-boehmite composite (A) obtained by hydrothermal treatment of aluminum hydroxide, and a substrate (I).

The present invention further provides a laminate obtained by laminating the above prepreg(s).

The present invention further provides a metal-foil-clad laminate obtained by bonding a metal foil to one surface or each surface of the above laminate.

DETAILED DESCRIPTION OF THE INVENTION

The present inventors have found that a printed wiring board which is obtained from a thermosetting resin composition obtained by incorporating as a filler an aluminum hydroxide-boehmite composite, obtained by hydrothermal treatment of aluminum hydroxide, into a thermosetting resin is free from irregularities of a molded appearance, excellent in heat resistance and good in solder heat resistance and electrical characteristics. Accordingly, the present inventors have completed the present invention.

The aluminum hydroxide-boehmite composite (A) used in the present invention is not specially limited so long as it is a composite composed of aluminum hydroxide with boehmite which composite is obtained by hydrothermal treatment of aluminum hydroxide. The aluminum hydroxide-boehmite composite (A) of the present invention is a composite in which boehmite crystallized in a boehmite-conversion step of aluminum hydroxide as a raw material by hydrothermal treatment is combined with aluminum hydroxide. It is different from a conventionally-known partial dehydrated product of aluminum hydroxide which is obtained by simply heating and calcining aluminum hydroxide in air.

The ratio of aluminum hydroxide and boehmite in the aluminum hydroxide-boehmite composite (A) can be selected from various ratios, while it is preferably in an aluminum hydroxide:boehmite weight ratio of 45:55 to 95:5, particularly preferably 50:50 to 90:10.

In the present invention, the ratio of aluminum hydroxide and boehmite in the aluminum hydroxide-boehmite composite (A) is determined by carrying out a thermal analysis measurement (TG-DTA) with a thermal analysis device in air under a temperature-increasing condition of 10° C./minute and making a calculation according to the following expression, on the basis of that theoretical values of total dehydration amounts of pure aluminum hydroxide and pure boehmite are 34.6% and 15% respectively.

$$34.6X + 15Y = Z$$

$$X + Y = 1$$

$$\therefore X = (Z - 15)/19.6$$

(X: ratio of aluminum hydroxide, Y: ratio of boehmite, Z: dehydration amount in an actual measurement)

An actual measurement value of a dehydration amount is introduced into Z, to obtain X, and a value of the obtained X, which is expressed as a percentage, is an aluminum hydroxide ratio. Further, X is deducted from 1 and the resultant value expressed as a percentage is a boehmite ratio.

The process for the production of the aluminum hydroxide-boehmite composite (A) is not specially limited, so long as it is a method in which aluminum hydroxide as a raw material is subjected to hydrothermal treatment. For example, aluminum hydroxide is dispersed or dissolved in water in an autoclave and it is subjected to hydrothermal treatment at a temperature of 100 to 200° C. at a pressure of 2 to 20 kgf/cm$^2$, whereby aluminum hydroxide-boehmite composites (A) having various ratios can be produced.

An aluminum hydroxide-boehmite composite (A) having an average particle diameter of 0.5 to 10 µm is preferably used. The aluminum hydroxide-boehmite composites (A), which are different in a particle size distribution or an average particle diameter, can be used alone or in combination as required.

The aluminum hydroxide-boehmite composite (A) of the present invention is a composite in which aluminum hydroxide is combined with boehmite crystallized in the step of converting aluminum hydroxide as a raw material into boehmite by hydrothermal treatment. In comparison with a conventionally-known partial dehydrated product of aluminum hydroxide which is obtained by heat-treating aluminum hydroxide in air, the aluminum hydroxide-boehmite composite (A) has a feature in that the dehydration temperature of water bonded to aluminum hydroxide becomes higher.

Although it is not clear what system causes the above difference, the following is estimated. In the partial dehydrated product of aluminum hydroxide, a partially-dehydrated aluminum hydroxide is generated by only dehydration of crystallization water from the surfaces of aluminum hydroxide particles. In contrast, in the case of the aluminum hydroxide-boehmite composite (A) of the present invention, a crystal of boehmite, which is generated by a precipitation reaction of boehmite taking place after the dissolution of a raw material aluminum hydroxide known as a generation system of boehmite, grows in contact with a crystal of aluminum hydroxide and restrains the crystal of aluminum hydroxide so that the dehydration of water bonding to the crystal of aluminum hydroxide is suppressed, which causes an increase in the dehydration temperature.

Further, obtained particles are different in the state of the surfaces thereof due to a difference in generation mechanisms between both. So many pores caused by the dehydration of crystallization water are found on the surfaces of particles of the partial dehydrated product of aluminum hydroxide. In contrast, the aluminum hydroxide-boehmite composite (A) of the present invention has no pores generated by the dehydration so that it is excellent in affinity to a resin and has a feature in that a molded appearance do not easily become irregular.

The amount of the aluminum hydroxide-boehmite composite (A) per 100 parts by weight of the thermosetting resin (D) is preferably 1 to 200 parts by weight, particularly preferably 20 to 120 parts by weight. When it is smaller than the lower limit of the above range, the aluminum hydroxide-boehmite composite (A) gives substantially no combined effect. When it is larger than the upper limit of the above range, application properties to a substrate and solder heat resistance are decreased.

The aluminum hydroxide-boehmite composite (A) of the present invention has higher heat resistance than aluminum hydroxide and has better flame resistance than boehmite. When it is used as a filler for the thermosetting resin (D), a cured product excellent in a balance between heat resistance and flame resistance can be obtained by using the composite (A) alone. However, it is preferred to use the composite (A) in combination with boehmite (B) or aluminum hydroxide (C) in view of the flame resistant level of the thermosetting resin (D) or a required level of the filler amount.

The boehmite (B), which is preferably used in the present invention, is a monohydrate of aluminum oxide. It is not specially limited so long as it is a product usable as a filler for a synthetic resin. Concretely, it includes, for example, a substance which is obtained by hydrothermally treating aluminum hydroxide at generally 150° C. to 300° C. in an autoclave to be recrystallized as a monohydrate of aluminum oxide.

The above hydrothermal treatment process of producing the boehmite (B) is basically the same as the before-mentioned process of producing the aluminum hydroxide-boehmite composite (A). However, the aluminum hydroxide-boehmite composite (A) is a product in which boehmite crystallized in the step of conversion into boehmite is combined with aluminum hydroxide. In contrast, the boehmite (B) is a product in which aluminum hydroxide as a raw material is completely converted into boehmite and the whole aluminum hydroxide as a raw material is recrystallized as a monohydrate of aluminum oxide.

The boehmite (B) may have any particle shape such as a granular shape, a plate shape, a needle shape or a polyhedral shape. Boehmite (B) having an average particle diameter of about 0.5 to 10 µm is preferably used. The boehmites (B), which are different from each other in a particle size distribution or an average particle diameter, can be used alone or in combination as required.

The mixing weight ratio of the aluminum hydroxide-boehmite composite (A) and the boehmite (B) is preferably in the range of from 45:55 to 95:5, particularly preferably from 50:50 to 90:10. When the ratio of the boehmite (B) is larger than 55, a decrease in flame retardancy is found, which does not agree with the object of the present invention.

The aluminum hydroxide (C), which is preferably used in the present invention, is not specially limited so long as it is aluminum hydroxide usable as a filler for an electronically insulating material. Such aluminum hydroxide is known, while aluminum hydroxide having a decreased soda content, which is a low conductivity product (a low soda product), is preferably used in view of insulation reliability. Aluminum hydroxide (C) having an average particle diameter of approximately 0.5 to 10 µm is used. The aluminum hydroxides (C), which are different from each other in a particle size distribution or an average particle diameter, can be used in combination as required.

The mixing weight ratio of the aluminum hydroxide-boehmite composite (A) and the aluminum hydroxide (C) is preferably in the range of from 55:45 to 95:5, particularly preferably from 60:40 to 90:10. When the ratio of the aluminum hydroxide (C) exceeds 45, a decrease in solder heat resistance is found, which does not agree with the object of the present invention.

The silane coupling agent (E), which is preferably used in the present invention, is not specially limited so long as it is a silane coupling agent which is generally used for surface-treating an inorganic substance. Such silane coupling agents are known. Concrete examples thereof aminosilane type coupling agents such as γ-aminopropyltriethoxysilane and N-β-(aminoethyl)-γ-aminopropyltrimethoxysilane, epoxysilane type coupling agents such as γ-glycidoxypropyltrimethoxysilane and β-(3,4-epoxycyclohexyl)ethyltrimethoxysilane, vinylsilane type coupling agents such as γ-methacryloxypropyltrimethoxysilane and vinyl-tri(β-methoxyethoxy)silane, cationic silane type coupling agents such as N-β-(N-vinylbenzylaminoethyl)-γ-aminopropyltrimethoxysilan e hydrochloride, and phenyl silane type coupling agents. These silane coupling agents may be used alone or in combination as required.

The method of mixing the silane coupling agent (E) includes, for example, a method in which the aluminum hydroxide-boehmite composite (A), the boehmite (B) or the aluminum hydroxide (C) is surface-treated with the silane coupling agent (E) in advance and a method in which the silane coupling agent (E) is added and dispersed into the thermosetting resin (D) or a solvent and then the aluminum hydroxide-boehmite composite (A), the boehmite (B) or the aluminum hydroxide (C) is mixed. The amount of the silane coupling agent (E) per 100 parts by weight of the thermosetting resin (D) is preferably 0.1 to 10 parts by weight, particularly preferably 0.5 to 5 parts by weight.

The wetting dispersing agent (F) being a preferred component in the present invention is not specially limited so long as it is a dispersion stabilizer usable for a coating composition. A copolymer-based wetting dispersing agent having an acid group is preferably used. Concrete examples thereof include Disperbyk-110, 111, 996, W903, etc., supplied by Byk chemi Japan. The method of adding the wetting dispersing agent (F) includes, for example, a method in which the wetting dispersing agent (F) is added to the thermosetting resin (D) or a solvent and then the aluminum hydroxide-boehmite composite (A), the boehmite (B) or the aluminum hydroxide (C) is mixed and a method in which the wetting dispersing agent (F) is dissolved in a solvent or the like in advance, the aluminum hydroxide-boehmite composite (A), the boehmite (B) or the aluminum hydroxide (C) is dispersed in the resultant solution and then the thermosetting resin (D) is mixed. The amount of the wetting dispersing agent (F) per 100 parts by weight of the thermosetting resin (D) is preferably 0.1 to 5 parts by weight, particularly preferably 0.2 to 2 parts by weight.

The thermosetting resin (D) used in the present invention is not specially limited so long as it is a nonhalogenated thermosetting resin usable for a printed wiring board material. Typical examples of the thermosetting resin (D) include a cyanate ester resin, a bismaleimide-cyanate ester resin, an epoxy resin, a maleimide resin, an unsaturated-group-containing polyphenylene ether resin and a benzoxazine resin. These thermosetting resins maybe used alone or in combination, as required, depending upon a purpose. A thermosetting resin containing a cyanate ester resin and a nonhalogenated epoxy resin as an essential component is more preferred.

A cyanate ester resin (G) which is preferably used in the thermosetting resin (D) of the present invention is not specially limited so long as it is a compound having at least two cyanato groups per molecule. Concrete examples thereof include 1,3- or 1,4-dicyanatobenzene, 1,3,5-tricyanotobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-dicyanatophenyl)methane, 2,2-bis(4-cyanatophenyl)propane, bis(4-cyanatophenyl)ether, bis(4-cyanatophenyl) thioether, bis(4-cyanotophenyl)sulfone, tris (4-cyanatophenyl)phosphite, tris(4-cyanatophenyl) phosphate and cyanates obtained by a reaction between novolak or a hydroxyl-group-containing thermoplastic resin oligomer (e.g., hydroxy polyphenyl ether, hydroxypolystyrene, etc.) and cyan halide. These cyanate ester resins may be used alone or in combination as required. More preferred are 2,2-bis(4-cyanatophenyl)propane and cyanates obtained by a reaction between novolak and cyan halide. Further, there may be preferably used a prepolymer having a weight-average molecular weight of 500 to 5,000 and having a triazine ring formed by the trimerization of cyanato group of any one of these cyanate ester compounds. For example, the above prepolymer can be produced by polymerizing a monomer of the above cyanate ester monomer in the presence of an acid such as a mineral acid or a Lewis acid; abase such as sodium alcolate or a tertiary amine or a salt such as sodium carbonate as a catalyst.

A nonhalogenated epoxy resin (H) which is preferably used in the thermosetting resin (D) of the present invention is not specially limited so long as it is a nonhalogenated compound having at least two epoxy groups per molecule. Typical examples thereof include a bisphenol A type epoxy resin, a bisphenol F type epoxy resin, a phenol novolak type epoxy resin, a cresol novolak type epoxy resin, a bisphenol A novolak type epoxy resin, a polyfunctional phenol type epoxy resin, a phosphorus-containing epoxy resin, a naphthalene type epoxy resin, a biphenyl type epoxy resin, a biphenyl novolak type epoxy resin, a cyclopentadiene type epoxy resin, an isocyanate-modified epoxy resin; polybutadiene, and epoxy compounds derived from a hydroxyl-group-containing silicon resin or the like. These epoxy resins may be used alone or in combination as required.

More preferred are a bisphenol F type epoxy resin, a phenol novolak type epoxy resin, a cresol novolak type epoxy resin, a polyfunctional phenol type epoxy resin, a naphthalene type epoxy resin, a biphenyl novolak type epoxy resin and a phosphorus-containing epoxy resin.

A curing agent and a curing accelerator for the thermosetting resin (D) may be used in combination with the thermosetting resin (D) as required. These agents are known and are not specially limited so long as they are generally-used ones. Typical examples of these include an amino compound, a phenol compound, acid anhydride, imidazoles and an organometallic salt. These may be used alone or in combination as required.

The thermosetting resin (D) may contain a flame retardant, a filler, an additive, and the like, so long as the inherent properties of the thermosetting resin (D) are not impaired. These materials are known and are not specially limited so long as they are generally-used ones.

The flame retardant includes hydrates such as magnesium hydroxide, molybdenum compounds such as molybdenum oxide and zinc molybdate, zinc borate, zinc stannate; phosphorus compounds such as phosphoric ester and melamine phosphate, nitrogen-containing compounds such as modified substances of melamine or benzoguanamine, and a silicon type compound.

Examples of the filler include natural silica, calcined silica, synthetic silica, amorphous silica, white carbon, titanium white, aerosil, kaolin, clay, talc, calcined kaolin, calcined clay, calcined talc, wollastonite, natural mica, synthetic mica, alumina, short glass fibers, glass fine powders and hollow glass. The other additive includes an ultraviolet absorber such as benzotriazole, an antioxidant such as hindered phenol and styrenated phenol, a photopolymerization initiator such as thioxanthone types, a fluorescent whitening agent such as stilbene derivatives, a photosensitizer, a dye, a pigment, a thickener, a lubricant, an anti-foamer, a leveling agent, a brightener, a polymerization inhibitor and a thixotropic agent. These additives may be used in combination as required.

The substrate (I) used in the present invention can be selected from known substrates used for various printed wiring board materials. Examples of a material of the substrate (I) includes inorganic fibers such as E glass, D glass, S glass, NE glass and quartz, and organic fibers or organic films such as polyimide, polyamide and polyester. The material is properly selected depending upon an intended use or performance, and the above materials may be used alone or in combination as required.

Examples of the form of the substrate (I) include a woven cloth, an unwoven cloth, roving, a chopped strand mat, and a surfacing mat. The thickness of the substrate (I) is not specially limited. Generally, it is approximately 0.02 to 0.3 mm. Further, substrates surface-treated with a silane coupling agent or the like and substrates physically opening-treated can be preferably used in view of hygroscopic heat resistance. When the substrate (I) is an organic film, the thickness of the film is not specially limited. It is preferably about 0.002 to 0.05 mm.

The production process of the prepeg of the present invention is not specially limited so long as it can produce a prepreg composed of the thermosetting resin (D) composition containing the aluminum hydroxide-boehmite composite (A) and the substrate (I). A concrete example thereof is a method in which the above thermosetting resin (D) composition is impregnated or applied into/to the substrate (I), and then the thermosetting resin (D) composition is B-staged by heating the resultant substrate in a dryer at 100 to 200° C. for 1 to 30 minutes, to obtain a prepeg. The amount of the thermosetting resin (D) composition to adhere to the substrate (I) is in the range of from 30 to 90% by weight based on the resin amount of the prepreg (including an inorganic filler).

When the thermosetting resin (D) composition is combined with the substrate (I), an organic solvent is used as required. The organic solvent is not specially limited in kind so long as it is compatible with the thermosetting resin (D). Typical examples thereof include acetone, methyl ethyl ketone, methyl cellosolve, propyrene glycol methyl ether, acetate thereof, toluene, xylene and dimethylformamide. These solvents may be used alone or in combination as required. When the impregnating ability to the substrate (I) is valued, it is preferred to use solvents having a boiling point of 120 to 200° C. in combination.

The concrete structure of the laminate or the metal-foil-clad laminate obtained by laminate-molding using the prepreg of the present invention will be explained. The laminate or the metal-foil-clad laminate is produced by stacking one prepreg or pluralities of prepregs of the present invention, placing a metal foil such as copper or aluminum on one surface or both surfaces of the stacked prepreg (s) and laminate-molding the resultant set. The metal foil to be used is not specially limited so long as it is a metal foil which is used for a printed wiring board material. As molding conditions, a general method of a laminate and a multilayer board for a printed wiring can be adopted. For example, generally, there is used a multiplaten press, a multiplaten vacuum press, continuous molding, an autoclave molding machine, etc., under conditions of a temperature: 100 to 300° C., a pressure: 2 to 100 kg/cm$^2$, and a heating time: 0.05 to 5 hours. Further, it is possible to obtain a multilayer board by combining the prepreg of the present invention with a wiring board for an internal layer, prepared separately, and laminate-molding the resultant set.

EFFECT OF THE INVENTION

The prepreg obtained from the flame-retardant thermosetting resin composition, provided by the present invention, has no appearance irregularities caused at a molding time. The laminate or the metal-foil-clad laminate obtained from the above prepreg is good in flame resistance and electrical characteristics and preferable as a printed wiring board material. The above flame-resistant thermosetting resin composition is a halogen-free composition, and the above laminate or metal-foil-clad laminate shows excellent solder heat resistance and can be applied to a lead-free solder. Therefore, it becomes possible to supply an environmentally friendly printed wiring board material and industrial practical utility is remarkably high.

EXAMPLES

The present invention will be explained in detail with reference to Examples and Comparative Examples hereinafter.

Production Example 1

100 parts by weight of aluminum hydroxide (H-42 I, supplied by Showa Denko K.K., average particle diameter 1 µm) was mixed with 500 part by weight of water and then was placed in an autoclave. The aluminum hydroxide in the autoclave was hydrothermal-treated at a temperature of 170° C. at a pressure of 8 kgf/cm$^2$ for 5 hours, to obtain a product. The product was dehydrated and then dried at 120° C., and the dried product was riddled to obtain an aluminum hydroxide-boehmite composite (1) having an average particle diameter of 2 µm (boehmite ratio: 20%).

Production Example 2

100 parts by weight of aluminum hydroxide (CL-303, supplied by Sumitomo Chemical Co. Ltd., average particle diameter 3 µm) was mixed with 300 part by weight of water and then was placed in an autoclave. The aluminum hydroxide in the autoclave was hydrothermal-treated at a temperature of 160° C. at a pressure of 6.3 kgf/cm$^2$ for 3 hours, to obtain a product. The product was dehydrated and then dried at 120° C., and the dried product was riddled to obtain an aluminum hydroxide-boehmite composite (2) having an average particle diameter of 3 µm (boehmite ratio: 10%)

Example 1

70 parts by weight of bis(3,5-dimethyl-4-maleimidephenyl)methane, 30 parts by weight of a prepolymer (BT-2070, supplied by Mitsubishi Gas Chemical Company, Inc.) of 2,2-bis(4-cyanatophenyl)propane and 0.5 part by weight of γ-glycidoxypropyltrimethoxysilane (A-187, supplied by Nihonunica Corporation) were dissolved in methyl ethyl ketone, and then 100 parts by weight of an aluminum hydroxide-boehmite composite (1) and 0.01 part by weight of zinc octylate were mixed with the resultant solution, to obtain a varnish. The varnish was diluted with methyl ethyl ketone, the diluted varnish was impregnated into an E glass cloth having a thickness of 0.1 mm, and the impregnated cloth was dried under heat at 150° C., to obtain prepregs having a resin content (including an inorganic filler, the same hereinafter) of 48% by weight. Eight sheets of the prepregs were stacked, 18 µm thick electrolytic copper foils were disposed on the upper surface and the lower surface of the stacked prepregs, and the resultant set was pressed at a pressure of 30 kg/cm$^2$ at a temperature of 220° C. for 120 minutes, to obtain a copper-clad laminate having a thickness of 0.8 mm.

Example 2

50 parts by weight of 4,4'-diphenylmethanebismaleimide, 15 parts by weight of a prepolymer of 2,2-bis(4-cyanatophenyl)propane (BT-2070), 35 parts by weight of a phenol novolak epoxy resin (Epikote 154, supplied by Japan Epoxy Resins Co., Ltd.) and 1 part by weight of Disperbyk-111 (supplied by BYK Chemie Japan) were dissolved in dimethylformamide, and then 80 parts by weight of an aluminum hydroxide-boehmite composite (1) and 0.01 part by weight of dimethylbenzylamine were mixed with the resultant solution, to obtain a varnish. A copper-clad laminate having a thickness of 0.8 mm was obtained in the same manner as in Example 1 except that the above varnish was used.

Example 3

55 parts by weight of bis(3-ethyl-5-methyl-4-maleimidephenyl)methane, 20 parts by weight of a prepolymer (PT-30, supplied by Lonza) of novolak cyanate obtained from phenol novolak and cyanogen chloride, 15 parts by weight of a bisphenol F type epoxy resin (Epikote 4001P, supplied by Japan Epoxy Resins Co., Ltd.), 10 parts by weight of a cresol novolak epoxy resin (ESCN220H, supplied by Sumitomo Chemical Co. Ltd.) and 1 part by weight of Disperbyk-996 (supplied by BYK Chemie Japan) were dissolved in methyl ethyl ketone, to obtain a solution. Separately, 80 parts by weight of an aluminum hydroxide-boehmite composite (2) and 20 parts by weight of boehmite (BMB, supplied by KAWAI LIME INDUSTRY CO., LTD.) were surface-treated with 1 part by weight of γ-glycidoxypropyltrimethoxysilane (A-187). Then, the surface-treated aluminum hydroxide-boehmite composite (2), the surface-treated boehmite and 0.01 part by weight of 2-ethyl-4-methylimidazole were mixed with the above solution, to obtain a varnish. A copper-clad laminate having a thickness of 0.8 mm was obtained in the same manner as in Example 1 except that the above varnish was used.

Example 4

35 parts by weight of a prepolymer (BT2070) of 2,2-bis(4-cyanatophenyl)propane, 45 parts by weight of a bisphenol F type epoxy resin (Epikote 4001P), 20 parts by weight of a naphthalene type epoxy resin (EPICLON HP-4032, supplied by Dainippon Ink And Chemicals, Incorporated), 0.5 part by weight of β-(3,4-epoxycyclohexyl)ethyltrimethoxysilane (A-186, supplied by Nihonunica Corporation) and 0.5 part by weight of Disperbyk-W903 (supplied by BYK Chemie Japan) were dissolved in methyl ethyl ketone, to obtain a solution. Then 60 parts by weight of an aluminum hydroxide-boehmite composite (2), 20 parts by weight of aluminum hydroxide (CL303), 10 parts by weight of zinc molybdate carried on talc (Kemgard 911C, supplied by Sherwin-Williams) and 0.02 part by weight of zinc octylate were mixed with the above solution to obtain a varnish. A copper-clad laminate having a thickness of 0.8 mm was obtained in the same manner as in Example 1 except that the above varnish was used.

Example 5

96.5 parts by weight of a phosphorus-containing epoxy resin (FX289, supplied by Tohto Kasei Co., Ltd.), 3.5 parts by weight of dicyandiamide and 0.5 part by weight of γ-aminopropyltriethoxysilane (A1100, supplied by Nihonunica Corporation) were dissolved in mixed solvents of dimethylfolmamide and methyl ethyl ketone and then 50 parts by weight of an aluminum hydroxide-boehmite composite (1) and 0.01 part by weight of 2-ethyl-4-methylimidazole were mixed with the resultant solution to obtain a varnish. The varnish was diluted with methyl ethyl ketone, the diluted varnish was impregnated into an E glass cloth having a thickness of 0.1 mm, and the impregnated glass cloth was dried under heat at 160° C. to obtain prepregs having a resin content of 45% by weight. Eight sheets of the prepregs were stacked, 18 μm thick electrolytic copper foils were disposed on the upper surface and the lower surface of the stacked prepregs, and the resultant set was pressed at a pressure of 30 kg/cm² at a temperature of 180° C. for 120 minutes, to obtain a copper-clad laminate having a thickness of 0.8 mm.

Example 6

50 parts by weight of a bisphenol F type epoxy resin (Epikote 4001P), 20 parts by weight of a phenol-and-salicylaldehyde-condensate type epoxy resin (Epikote 1032, supplied by Japan Epoxy Resins Co., Ltd.), 20 parts by weight of a melamine-modified novolak resin (Epikure YLH828, supplied by Japan Epoxy Resins Co., Ltd.), 10 parts by weight of a phenol novolak resin (Phenolite TD2131, supplied by Dainippon Ink And Chemicals, Incorporated) and 0.5 part by weight of Disperbyk-111 (supplied by BYK Chemie Japan) were dissolved in methyl ethyl ketone and then 70 parts by weight of an aluminum hydroxide-boehmite composite (1), 30 parts by weight of boehmite (BMB) and 0.01 part by weight of dimethylbenzylamine were mixed with the resultant solution to obtain a varnish. A copper-clad laminate having a thickness of 0.8 mm was obtained in the same manner as in Example 5 except that the above varnish was used.

Example 7

50 parts by weight of a bisphenol F type epoxy resin (Epikote 4001P), 20 parts by weight of a cresol novolak epoxy resin (ESCN220H), 20 parts by weight of a phenol novolak resin (Phenolite TD2090, supplied by Dainippon Ink And Chemicals, Incorporated), 10 parts by weight of 9,10-dihydro-9-oxa-10-phosphaphenanthrene-10-oxide (HCA, supplied by SANKO CO., LTD.) and 1 part by weight of Disperbyk-110 (supplied by BYK Chemie Japan) were dissolved in propylene glycol monomethylether, to obtain a solution. Separately, 50 parts by weight of an aluminum hydroxide-boehmite composite (2) and 20 parts by weight of aluminum hydroxide (CL303) were surface-treated with 1 part by weight of γ-glycidoxypropyltrimethoxysilane (A-187). Then, the surface-treated aluminum hydroxide-boehmite composite (2), the surface-treated aluminum hydroxide and 0.03 part by weight of dimethylbenzylamine were mixed with the above solution, to obtain a varnish. A copper-clad laminate having a thickness of 0.8 mm was obtained in the same manner as in Example 5 except that the above varnish was used.

Comparative Example 1

A varnish was obtained in the same manner as in Example 1 except that 100 parts by weight of the aluminum hydroxide-boehmite composite (A) was replaced with 100 parts by weight of a partially-dehydrated product of aluminum hydroxide obtained by heat-treating aluminum hydroxide (CL303) in a hot-air drier at 200° C. for 48 hours and then riddling the heat-treated aluminum hydroxide.

A copper-clad laminate having a thickness of 0.8 mm was obtained in the same manner as in Example 1 except that the above varnish was used.

Comparative Example 2

A varnish was obtained in the same manner as in Example 3 except that 80 parts by weight of the aluminum hydroxide-boehmite composite (2) and 20 parts by weight of the boehmite used in Example 3 were replaced with 100 parts by weight of boehmite (BMB). A copper-clad laminate having a thickness of 0.8 mm was obtained in the same manner as in Example 1 except that the above varnish was used.

Comparative Example 3

A varnish was obtained in the same manner as in Example 6 except that 70 parts by weight of the aluminum hydroxide-boehmite composite (1) and 30 parts by weight of the boehmite used in Example 6 were replaced with 100 parts by weight of aluminum hydroxide (CL303). A copper-clad laminate having a thickness of 0.8 mm was obtained in the same manner as in Example 5 except that the above varnish was used.

The laminates obtained in Examples and Comparative Examples were evaluated and Table 1 shows results thereof.

TABLE 1

|  | Appearance of laminate | Solder heat resistance 280° C., 3 min. | Insulation resistance D-6/100 | Flame resistance (UL method) |
|---|---|---|---|---|
| Example 1 | No appearance irregularities | No failure | $5 \times 10^{12}$ Ω | V-0 |
| Example 2 | No appearance irregularities | No failure | $8 \times 10^{12}$ | V-0 |
| Example 3 | No appearance irregularities | No failure | $1 \times 10^{13}$ | V-0 |
| Example 4 | No appearance irregularities | No failure | $5 \times 10^{12}$ | V-0 |
| Example 5 | No appearance irregularities | No failure | $7 \times 10^{12}$ | V-0 |
| Example 6 | No appearance irregularities | No failure | $8 \times 10^{12}$ | V-0 |
| Example 7 | No appearance irregularities | No failure | $4 \times 10^{12}$ | V-0 |
| Comparative Example 1 | Appearance irregularities found | No failure | $2 \times 10^{12}$ | V-1 |
| Comparative Example 2 | No appearance irregularities | No failure | $4 \times 10^{12}$ | Burnt |
| Comparative Example 3 | No appearance irregularities | Delamination occurred | $6 \times 10^{12}$ | V-0 |

Test Methods

Appearance of laminate: Judged by visual observation after etching copper foils.

Solder heat resistance: According to JIS C6481.
Insulation resistance: According to JIS C6481.
Flame resistance: According to a UL94 vertical test method.

What is claimed is:

1. A prepreg for a printed wiring board material comprising
    a thermosetting resin (D) composition containing, as an essential component, an aluminum hydroxide-boehmite composite (A) obtained by hydrothermal treatment of aluminum hydroxide, boehmite (B), and a substrate (I), wherein the weight ratio of the aluminum hydroxide-boehmite composite (A) to boehmite (B) is in the range of from 45:55 to 95:5, and the weight ratio of aluminum hydroxide to boehmite in the aluminum hydroxide-boehmite composite (A) is in the range of from 45:55 to 95:5.

2. The prepreg according to claim 1,
    wherein the amount of the aluminum hydroxide-boehmite composite (A) per 100 parts by weight of the thermosetting resin (D) is 1 to 200 parts by weight.

3. The prepreg according to claim 1,
    wherein the thermosetting resin (D) composition further contains a silane coupling agent (E).

4. The prepreg according to claim 1,
    wherein the thermosetting resin (D) contains a cyanate ester resin (G) or a nonhalogenated epoxy resin (H).

5. The prepreg according to claim 4,
    wherein the cyanate ester resin (G) is 2,2-bis(4-cyanatophenyl)propane, cyanates obtained by a reaction between novolak and cyan halide, or a mixture of these.

6. The prepreg according to claim 4,
    wherein the nonhalogenated epoxy resin (H) is one member or at least two members selected from the group consisting of a bisphenol F type epoxy resin, a phenol novolak type epoxy resin, a cresol novolak type epoxy resin, a polyfunctional phenol type epoxy resin, a naphthalene type epoxy resin, a biphenyl novolak type epoxy resin and a phosphorus-containing epoxy resin.

7. A laminate obtained by stacking the prepreg as recited in claim 1.

8. A metal-foil-clad laminate obtained by bonding metal foil(s) to one surface or both surfaces of the laminate as recited in claim 7.

9. The prepreg according to claim 1,
    wherein the thermosetting resin (D) composition further contains a wetting dispersing agent (F).

* * * * *